(12) United States Patent
Chen

(10) Patent No.: US 7,196,560 B2
(45) Date of Patent: Mar. 27, 2007

(54) CLOCK FREQUENCY MULTIPLIER AND METHOD FOR MULTIPLYING A CLOCK FREQUENCY

(75) Inventor: Huang-Chung Chen, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 23 days.

(21) Appl. No.: 11/160,057

(22) Filed: Jun. 7, 2005

(65) Prior Publication Data

US 2006/0273833 A1    Dec. 7, 2006

(51) Int. Cl.
*H03B 19/00* (2006.01)
(52) U.S. Cl. .................... 327/116; 327/119; 327/113
(58) Field of Classification Search ............... 327/113, 327/116, 119, 122
See application file for complete search history.

(56) References Cited

U.S. PATENT DOCUMENTS 6,195,392 B1* 2/2001 O'Grady ............... 375/240.28
7,064,617 B2* 6/2006 Hein et al. .................. 331/16

* cited by examiner

*Primary Examiner*—Dinh T. Le
(74) *Attorney, Agent, or Firm*—J.C. Patents

(57) ABSTRACT

A clock frequency multiplier is provided. The clock frequency multiplier comprises a tracking circuit, a pulsing circuit, and a shaping circuit. The tracking circuit receives a clearing signal and a reference clock signal, outputs the quotient of the number of cycles of the reference clock signal in a cycle of the clearing signal divided by a first predetermined value. The pulsing circuit outputs a pulsing signal wherein the frequency of the pulsing signal is the frequency of the clearing signal multiplied by the first predetermined value. The shaping circuit divides the frequency of the pulsing signal by a second predetermined value and shapes the pulsing signal into a clock signal with a predetermined duty cycle, and outputs the divided and shaped pulsing signal as an output clock signal.

21 Claims, 2 Drawing Sheets

CLOCK FREQUENCY MULTIPLIER AND METHOD FOR MULTIPLYING A CLOCK FREQUENCY

BACKGROUND OF THE INVENTION

1. Field of the Invention

The present invention relates to a clock frequency multiplier and a method for multiplying a clock frequency. More particularly, the present invention relates to a clock frequency multiplier implemented with a pure digital logic circuit, and a method thereof.

2. Description of the Related Art

Conventionally, a clock frequency multiplier is usually implemented with a phase lock loop (PLL) as the PLL has excellent output quality. However, the PLL includes some analog components (such as an operational amplifier) and some passive components (such as resistors and capacitors). These components occupy a large area of an integrated circuit. Moreover, the components need separate simulation, or even require separate design and layout for different fabrication processes.

However, the superior output quality of the PLL may not be necessary for some integrated circuits as the circuits only need stable frequency multiplication. In such circumstances, it is desirable to have a clock frequency multiplier offering stable frequency multiplication without incurring the problems as mentioned above.

SUMMARY OF THE INVENTION

Accordingly, the present invention is directed to a clock frequency multiplier, which is implemented with a pure digital logic circuit, offers stable frequency multiplication, and does not have the problems of analog components and passive components in fabrication processes. And the present invention is also directed to a method for multiplying a clock frequency.

According to an embodiment of the present invention, a clock frequency multiplier is provided. The clock frequency multiplier comprises a tracking circuit, a pulsing circuit, and a shaping circuit. The tracking circuit receives a clearing signal and a reference clock signal, outputs the quotient of the number of cycles of the reference clock signal in a cycle of the clearing signal divided by a first predetermined value. The pulsing circuit receives the clearing signal and the reference clock signal, receives one of the quotient and a compensated quotient derived from the quotient, and outputs a pulsing signal, wherein the frequency of the pulsing signal is that of the clearing signal multiplied by the first predetermined value. The shaping circuit receives the clearing signal, the reference clock signal and the pulsing signal. The shaping circuit then divides the frequency of the pulsing signal by a second predetermined value and shapes the pulsing signal into a clock signal with a predetermined duty cycle, and outputs the divided and shaped pulsing signal as an output clock signal.

According to another embodiment of the present invention, a method for multiplying a clock frequency is provided. The method comprises a calculating step, a providing step, and a dividing and shaping step. The calculating step calculates a quotient of the number of cycles of a reference clock signal in a cycle of a clearing signal divided by a first predetermined value. The providing step provides a pulsing signal according to the clearing signal, the reference clock signal, and one of the quotient and a compensated quotient derived from the quotient, wherein the frequency of the pulsing signal is the frequency of the clearing signal multiplied by the first predetermined value. The dividing and shaping step divides the frequency of the pulsing signal by a second predetermined value and shapes the pulsing signal into a clock signal with a predetermined duty cycle according to the clearing signal and the reference clock signal. And then the dividing and shaping step provides the divided and shaped pulsing signal as an output clock signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
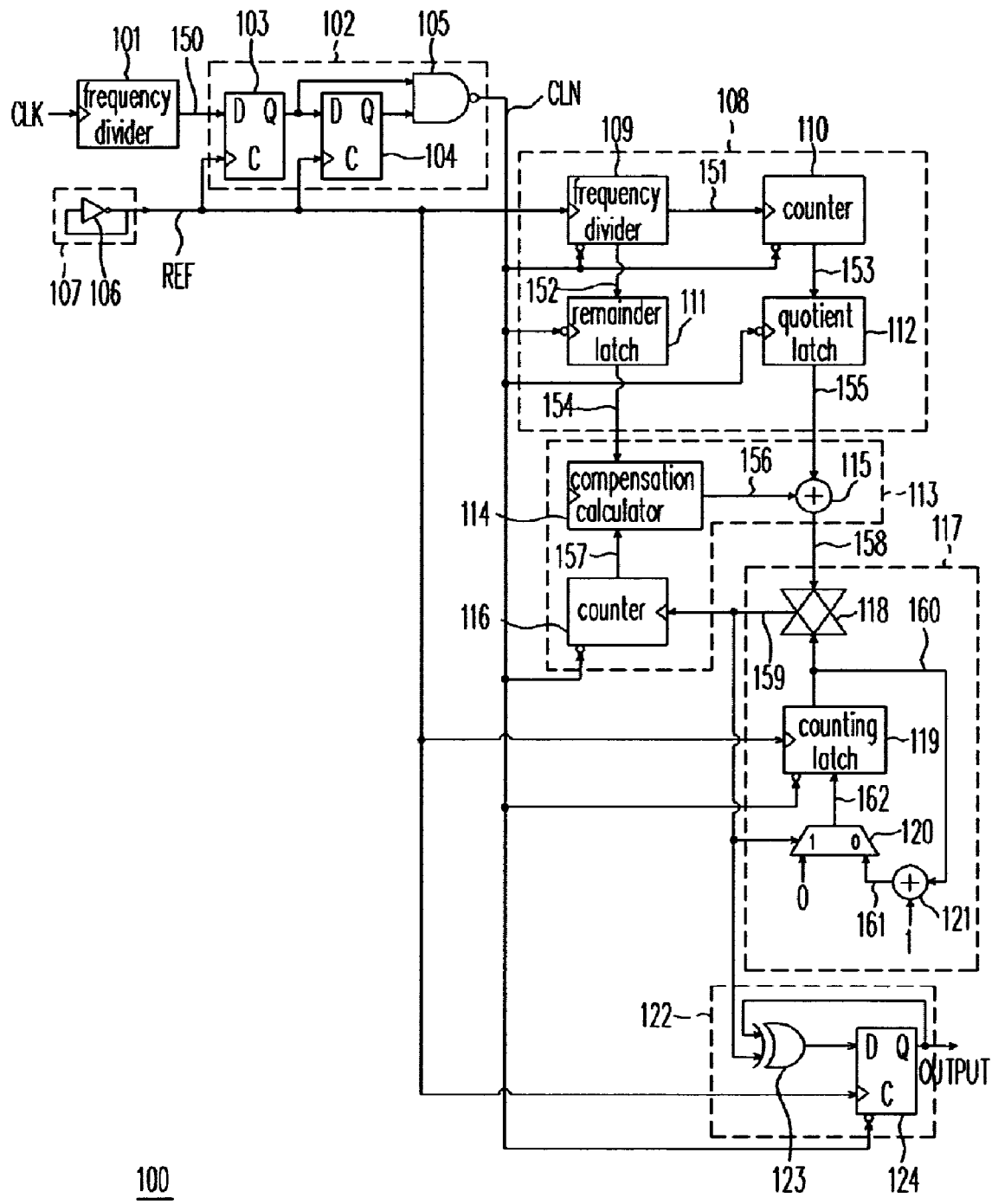
FIG. 1 is a block diagram showing a clock frequency multiplier according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Please refer to FIG. 1. FIG. 1 is a block diagram of the clock frequency multiplier 100 according to an embodiment of the present invention. The clock frequency multiplier 100 receives an input clock signal CLK and outputs an output clock signal OUTPUT. The clock frequency multiplier 100 comprises a ring oscillator 107, a frequency divider 101, a leading edge detector 102, a tracking circuit 108, a compensation circuit 113, a pulsing circuit 117, and a shaping circuit 122.

The ring oscillator 107 provides the high-frequency reference clock signal REF. In this embodiment the ring oscillator 107 comprises an inverter 106 connected as a delay loop.

The frequency divider 101 divides the frequency of the input clock signal CLK by a predetermined value (denoted as N) and outputs a divided input clock signal 156. If we denote the frequency of the input clock signal CLK as $F_{CLK}$, then the frequency of the divided input clock signal 150 is $F_{CLK}/N$. The purpose of the frequency divider 101 is to provide clock frequency division function in the clock frequency multiplier 100, in addition to the clock frequency multiplication, which will be described below.

The leading edge detector 102 comprises D flip-flops 103 and 104, and an NAND gate 105. The D flip-flop 103 receives the divided input clock signal 150 as its input D, and the reference clock signal REF as its input C. The D flip-flop 104 receives the output Q of the D flip-flop 103 as its input D, and the reference clock signal REF as its input C. The NAND gate 105 receives the output Q of the D flip-flop 103 and the output Q of the D flip-flop 104, and outputs a clearing signal CLN. As one skilled in the relevant art will easily understand, the clearing signal CLN provides a low pulse at every rising edge of the divided input clock signal 150, and the frequency of the clearing signal CLN is the same as that of the divided input clock signal 150, that is, $F_{CLK}/N$.

The tracking circuit 108 provides a quotient 155 and a remainder 154, which are vital to the operation of the clock frequency multiplier 100. Their values are obtained from dividing the number of cycles of the reference clock signal REF in a cycle of the clearing signal CLN by a predetermined value (denoted as M). Actually, the tracking circuit 108 provides the remainder 154 and the quotient 155 obtained in the last cycle of the clearing signal CLN. Therefore, any frequency drift caused by factors such as temperature variation will be readily reflected in the values of the remainder 154 and the quotient 155.

The tracking circuit 108 comprises a frequency divider 109, a counter 110, a remainder latch 111, and a quotient latch 112.

The frequency divider 109 receives the clearing signal CLN and the reference clock signal REF, divides the frequency of the reference clock signal REF by M and outputs a divided reference clock signal 151. The frequency divider 109 also provides the above remainder on its output signal 152, which is latched and output as the remainder 154 by the remainder latch 111 at the beginning of every cycle of the clearing signal CLN.

The counter 110 accumulates its output 153 at every rising edge of the divided reference clock signal 151 and clears its output 153 at the beginning of every cycle of the clearing signal CLN. As it can be seen, at the beginning of every cycle of the clearing signal CLN (or at the end of every cycle of the clearing signal CLN), the value of signal 153 is equal to the quotient mentioned above. The quotient latch 112 latches and outputs signal 153 as the quotient 155 at the beginning of every cycle of the clearing signal CLN.

A compensation circuit 113 outputs a compensated quotient 158 according to the quotient 155, the remainder 154, the clearing signal CLN, and the pulsing signal 159. In brief, the compensation circuit 113 serves to even out intervals between consecutive pulses of the pulsing signal 159 so that the output clock signal OUTPUT will have a more regular waveform. The compensation circuit 113 has no substantial effect on the frequencies of the pulsing signal 159 and the output clock signal OUTPUT, and is not included in some embodiments of the present invention. The compensation circuit 113 will be described in more details later. For now, let's assume the compensation circuit 113 does not exist and the compensated quotient 158 is the same as the quotient 155.

A pulsing circuit 117 outputs a pulsing signal 159, whose frequency is the frequency of the clearing signal CLN multiplied by M, i.e., $F_{CLK}*M/N$. The pulsing signal 159 serves as the base signal for generating the output clock signal OUTPUT. The pulsing circuit comprises a comparator 118, a counting latch 119, a multiplexer 120, and an adder 121.

Initially, the value of the pulsing signal 159 is zero. The multiplexer selects the output 161 of the adder 121 as its own output 162, which is provided as the input of the counting latch 119. The counting latch 119 latches and outputs signal 162 as its output 160 at every rising edge of the reference clock signal REF. The output 160 is in turn provided as the input of the adder 121. In such a case, as depicted in FIG. 1, the value of signal 162 is the value of signal 160 plus one. Therefore, at every rising edge of the reference clock signal REF, the output 160 of the counting latch 119 accumulates by one.

A comparator 118 compares the output 160 of the counting latch 119 and the compensated quotient 158 (or the quotient 155 in embodiments without the compensation circuit 113), and outputs the pulsing signal 159 according to the comparison result. The comparator 118 outputs zero on the pulsing signal 159 when its two inputs are unequal and outputs one on the pulsing signal 159 when its two inputs are equal. When the pulsing signal 159 is equal to one, the multiplexer 120 will select zero as its output 162 so that the counting of the output 160 of the counting latch 119 will start over again. At the beginning of every cycle of the clearing signal CLN, the counting latch 119 clears its output 160 and the counting of the output 160 will also start over again. According to the above discussion, the pulsing signal 159 provides a high pulse whenever the output 160 of the counting latch 119 is equal to the compensated quotient 158 (or the quotient 155 in the embodiments without the compensation circuit 113). Therefore, the frequency of the pulsing signal 159 is $F_{CLK}*M/N$.

A shaping circuit 122 receives the pulsing signal 159 and outputs the output clock signal OUTPUT. The shaping circuit 122 comprises the XOR (exclusive-or) gate 123 and the D flip-flop 124. The XOR gate 123 receives the output clock signal OUTPUT and the pulsing signal 159. The D flip-flop 124 receives the output of the XOR gate 123 as its input D, the reference clock signal REF as its input C, and the clearing signal CLN as its input CLR. The D flip-flop 124 provides its output Q as the output clock signal OUTPUT. As one skilled in the relevant art will easily understand, the shaping circuit 122 divides the frequency of the pulsing signal 159 by a predetermined value (2 in this embodiment) and shapes the pulsing signal 159 into a clock signal with a 50% duty cycle. Here the "shaping" of the pulsing signal 159 means changing the duty cycle of the pulsing signal 159 to 50%. The output clock signal OUTPUT is simply the pulsing signal 159 put through the frequency division and the shaping. The frequency of the output clock signal OUTPUT is $(F_{CLK}*M/N)/2$.

Although the shaping circuit 122 of this embodiment changes the duty cycle of the pulsing signal 159 to 50%, please note that the present invention is not limited to a duty cycle of 50%. In other embodiments of the present invention, the shaping circuit can be implemented to shape the pulsing signal into a predetermined duty cycle other than 50%.

Before we discuss the compensation circuit 113 in details, we have to understand the effect of compensation. Assuming, in this embodiment, the frequency of the reference clock signal REF is 41 times that of the clearing signal CLN and the predetermined value M is equal to 6. Since there are 41 cycles of the reference clock signal REF in a cycle of the clearing signal CLN, let's denote the position of the first cycle of the reference clock signal REF as 1 and the position of the last cycle of the reference clock signal REF as 41. Table 1 below shows the effect of compensation on the pulsing signal 159. As it can be seen, without compensation, the difference between the maximum pulse interval and the minimum pulse interval of the pulsing signal 159 is five. In other words, the maximum pulse interval is two times the minimum pulse interval. This is caused by the remainder (5) of dividing 41 by the predetermined value M (6). Such irregularity will also appear in the output clock signal OUTPUT. This is obviously undesirable.

On the other hand, if we distribute the remainder into the pulse intervals, i.e., "compensate" the pulse intervals, as evenly as possible, we will get a much better result. As shown in the bottom row of table 1, with compensation, the difference between the maximum pulse interval and the minimum pulse interval of the pulsing signal 159 is only one. Therefore, the output clock signal OUTPUT will be much more regular. The compensation is achieved by simply postponing some pulses of the pulsing signal 159.

TABLE 1 the effect of compensation on the pulsing signal 159.

|  | Positions of high pulses of the pulsing signal 159 | Intervals between consecutive high pulses of the pulsing signal 159 |
| --- | --- | --- |
| Without compensation | 6, 12, 18, 24, 30, 36 | 5, 5, 5, 5, 5, 10 |
| With compensation | 6, 13, 20, 27, 34, 41 | 6, 6, 6, 6, 6, 5 |

In detail, the compensation circuit 113 comprises the counter 116, the compensation calculator 114, and the adder 115. The counter 116 accumulates its output 157 at every pulse of the pulsing signal 159 and clears its output 157 at the beginning of every cycle of the clearing signal CLN. The purpose of counter 116 is keeping track of the number of pulses of the pulsing signal 159 in a cycle of the clearing signal CLN. The compensation calculator 114 outputs the compensation signal 156 to postpone some pulses of the pulsing signal 159 according to the remainder 154, the output 157 of the counter 116, and the predetermined value M. The value of the compensation signal 156 is the number of cycles of the reference clock signal REF for which the next pulse of the pulsing signal 159 will be postponed. The compensation calculator 114 has built-in tables for various combinations of the remainder 154, the output 157 of the counter 116, and the predetermined value M. Finally, the adder 115 outputs the sum of the quotient 155 and the compensation signal 156 as the compensated quotient 158.

According to the above discussion, the clock frequency multiplier 100 in this embodiment multiplies the frequency of the input clock signal CLK by a factor of (M/N)/2. The clock frequency multiplier 100 is implemented with the pure digital logic circuit, offers stable frequency multiplication, and does not have the problems of analog components and passive components in fabrication processes.

Figure 2:
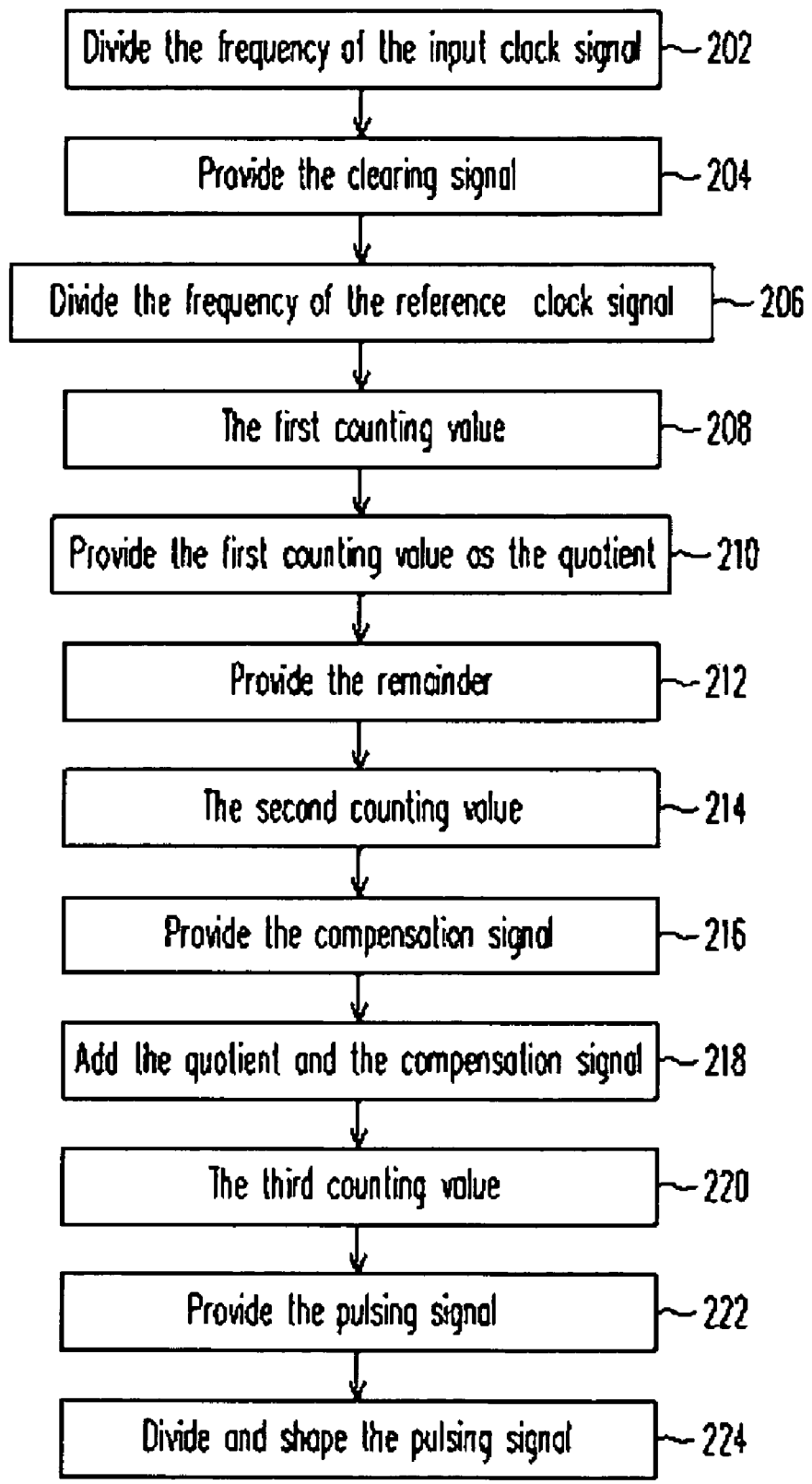
FIG. 2 is a flow chart showing the flow of a method for multiplying a clock frequency according to an embodiment of the present invention.

Now please refer to FIG. 2. FIG. 2 is a flow chart of a method for multiplying a clock frequency according to an embodiment of the present invention. The flow of the method is similar to the operation of the clock frequency multiplier 100 in the previous embodiment. The flow begins at step 202.

In step 202, the frequency of the input clock signal is divided by the predetermined value N to provide the divided input clock signal. Then in step 204, the clearing signal according to the divided input clock signal and the reference clock signal is provided such that the clearing signal provides a low pulse at every rising edge of the divided input clock signal and the frequency of the clearing signal is the same as that of the divided input clock signal.

Steps 206 to 212 are for generating the quotient and the remainder in the previous embodiment. In step 206, the frequency of the reference clock signal is divided by the predetermined value M to output the divided reference clock signal. And then in step 208, a first counting value in response to the divided reference clock signal is accumulated, and the first counting value in response to the clearing signal is cleared. In step 210, there provides the first counting value as the quotient in response to the clearing signal. Finally, in step 212, there provides, in response to the clearing signal, the remainder of the number of cycles of the reference clock signal in a cycle of the clearing signal divided by the predetermined value M.

Steps 214 to 218 are for generating the compensated quotient in the previous embodiment. In step 214, a second counting value in response to the pulsing signal is accumulated and the second counting value in response to the clearing signal is cleared. Then in step 216, there provides the compensation signal according to the remainder, the second counting value, and the predetermined value M, to postpone some pulses of the pulsing signal. And then in step 218, the quotient and the compensation signal are added, and the sum is provided as the compensated quotient.

Steps 220 and 222 are for generating the pulsing signal in the previous embodiment. In step 220, accumulate a third counting value in response to the reference clock signal and clear the third counting value in response to the clearing signal and the pulsing signal. And then in step 222, provide the pulsing signal according to the comparison of the third counting value and the compensated quotient.

Finally, in step 224, divide the frequency of the pulsing signal by a predetermined value (2 in this embodiment). In the same time, shape the pulsing signal into a clock signal with a predetermined duty cycle (50% in this embodiment) according to the clearing signal and the reference clock signal. And provide the divided and shaped pulsing signal as the output clock signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clock frequency multiplier, comprising:
    a tracking circuit, receiving a clearing signal and a reference clock signal, outputting a quotient of a number of cycles of the reference clock signal in a cycle of the clearing signal divided by a first predetermined value;
    a pulsing circuit, receiving the clearing signal and the reference clock signal, receiving one of the quotient and a compensated quotient derived from evening out intervals between consecutive pulses of a pulsing signal, and outputting the pulsing signal, wherein the frequency of the pulsing signal is the frequency of the clearing signal multiplied by the first predetermined value; and
    a shaping circuit, receiving the clearing signal, the reference clock signal and the pulsing signal, dividing the frequency of the pulsing signal by a second predetermined value and shaping the pulsing signal into a clock signal with a predetermined duty cycle, and outputting the divided and shaped pulsing signal as an output clock signal.

2. The clock frequency multiplier according to claim 1, wherein the tracking circuit comprises:
    a first frequency divider, receiving the clearing signal and the reference clock signal, dividing the frequency of the reference clock signal by the first predetermined value and outputting the divided reference clock signal;
    a first counter, incrementing an output of the first counter in response to the divided reference clock signal, and clearing the output of the first counter in response to the clearing signal; and
    a quotient latch, latching and outputting the output of the first counter as the quotient in response to the clearing signal.

3. The clock frequency multiplier according to claim 2, wherein the tracking circuit further comprises:

a remainder latch, latching and outputting, in response to the clearing signal, a remainder of the number of cycles of the reference clock signal in a cycle of the clearing signal divided by the first predetermined value, wherein the remainder is provided by the first frequency divider.

4. The clock frequency multiplier according to claim 3, further comprising:

a compensation circuit, outputting the compensated quotient according to the quotient, the remainder, the clearing signal, and the pulsing signal, to even out intervals between consecutive pulses of the pulsing signal.

5. The clock frequency multiplier according to claim 4, wherein the compensation circuit further comprises:

a second counter, incrementing an output of the second counter in response to the pulsing signal and clearing the output of the second counter in response to the clearing signal;

a compensation calculator, outputting a compensation signal according to the remainder, the output of the second counter, and the first predetermined value, to postpone some pulses of the pulsing signal; and a first adder, outputting a sum of the quotient and the compensation signal as the compensated quotient.

6. The clock frequency multiplier according to claim 1, wherein the pulsing circuit further comprises:

a counting latch, latching an input of the counting latch as an output of the counting latch in response to the reference clock signal and clearing the output of the counting latch in response to the clearing signal;

a second adder, providing the output of the counting latch plus one as an output of the second adder;

a multiplexer, selecting and outputting one of a number zero and the output of the second adder according to the pulsing signal as the input of the counting latch; and a comparator, outputting the pulsing signal according to a comparison of the output of the counting latch and one of the quotient and the compensated quotient.

7. The clock frequency multiplier according to claim 1, wherein the second predetermined value is two.

8. The clock frequency multiplier according to claim 7, wherein the shaping circuit further comprises:

an XOR gate, receiving the output clock signal and the pulsing signal; and a first D flip-flop, receiving the output of the XOR gate as the input D of the first D flip-flop, the reference clock signal as the input C of the first D flip-flop, and the clearing signal as the input CLR of the first D flip-flop, providing the output Q of the first D flip-flop as the output clock signal.

9. The clock frequency multiplier according to claim 1, further comprising:

a second frequency divider, receiving an input clock signal, dividing the frequency of the input clock signal by a third predetermined value and outputting the divided input clock signal; and a leading edge detector, outputting the clearing signal according to the divided input clock signal and the reference clock signal.

10. The clock frequency multiplier according to claim 9, wherein the leading edge detector further comprises:

a second D flip-flop, receiving the divided input clock signal as the input D of the second D flip-flop and the reference clock signal as the input C of the second D flip-flop;

a third D flip-flop, receiving the output Q of the second D flip-flop as the input D of the third D flip-flop and the reference clock signal as the input C of the third D flip-flop; and an NAND gate, receiving the output Q of the second D flip-flop and the output Q of the third D flip-flop, providing an output of the NAND gate as the clearing signal.

11. The clock frequency multiplier according to claim 1, wherein the reference clock signal is provided by an inverter connected as a delay loop.

12. The clock frequency multiplier according to claim 1, wherein the predetermined duty cycle is 50%.

13. A method for multiplying a clock frequency, comprising:

obtaining a quotient of a number of cycles of a reference clock signal in a cycle of a clearing signal divided by a first predetermined value;

providing a pulsing signal according to the clearing signal, the reference clock signal, and one of the quotient and a compensated quotient derived from evening out intervals between consecutive pulses of a pulsing signal, wherein the frequency of the pulsing signal is the frequency of the clearing signal multiplied by the first predetermined value; and dividing the frequency of the pulsing signal by a second predetermined value and shaping the pulsing signal into a clock signal with a predetermined duty cycle according to the clearing signal and the reference clock signal, and providing the divided and shaped pulsing signal as an output clock signal.

14. The method according to claim 13, wherein the step of calculating the quotient further comprises:

dividing the frequency of the reference clock signal by the first predetermined value and outputting the divided reference clock signal;

accumulating a first counting value in response to the divided reference clock signal, and clearing the first counting value in response to the clearing signal; and providing the first counting value as the quotient in response to the clearing signal.

15. The method according to claim 14, wherein the step of calculating the quotient further comprises:

providing, in response to the clearing signal, a remainder of the number of cycles of the reference clock signal in a cycle of the clearing signal divided by the first predetermined value.

16. The method according to claim 15, further comprising:

providing the compensated quotient according to the quotient, the remainder, the clearing signal, and the pulsing signal, to even out intervals between consecutive pulses of the pulsing signal.

17. The method according to claim 16, wherein the step of providing the compensated quotient further comprises:

accumulating a second counting value in response to the pulsing signal and clearing the second counting value in response to the clearing signal;

providing a compensation signal according to the remainder, the second counting value, and the first predetermined value, to postpone some pulses of the pulsing signal; and adding the quotient and the compensation signal and providing the sum as the compensated quotient.

18. The method according to claim 13, wherein the step of providing the pulsing signal further comprises:

accumulating a third counting value in response to the reference clock signal and clearing the third counting value in response to the clearing signal and the pulsing signal; and providing the pulsing signal according to a comparison of the third counting value and one of the quotient and the compensated quotient.

19. The method according to claim 13, wherein the second predetermined value is two.

20. The method according to claim 13, further comprising:

dividing the frequency of an input clock signal by a third predetermined value and providing the divided input clock signal; and providing the clearing signal according to the divided input clock signal and the reference clock signal such that the clearing signal provides a low pulse at every rising edge of the divided input clock signal and the frequency of the clearing signal is the same as that of the divided input clock signal.

21. The method according to claim 13, wherein the predetermined duty cycle is 50%.

* * * * *